(12) United States Patent
Hsieh et al.

(10) Patent No.: US 10,093,774 B2
(45) Date of Patent: Oct. 9, 2018

(54) MODIFIED POLYPHENYLENE ETHER RESIN, METHOD OF MAKING THE SAME AND RESIN COMPOSITION

(71) Applicant: Elite Electronic Material (KunShan) Co., Ltd., Kunshan, Jiangsu Province (CN)

(72) Inventors: Chen Yu Hsieh, Taoyuan (TW); Yan Zhang, Kunshan (CN)

(73) Assignee: ELITE ELECTRONICS MATERIAL (KUNSHAN) CO., LTD., Kunshan, Jiangsu Province (CN)

( * ) Notice: Subject to any disclaimer, the term of this patent is extended or adjusted under 35 U.S.C. 154(b) by 316 days.

(21) Appl. No.: 15/234,478

(22) Filed: Aug. 11, 2016

(65) Prior Publication Data

US 2017/0190837 A1  Jul. 6, 2017

(30) Foreign Application Priority Data

Dec. 30, 2015  (CN) .......................... 2015 1 1023931

(51) Int. Cl.
| | |
|---|---|
| *C08G 65/48* | (2006.01) |
| *C08J 5/24* | (2006.01) |
| *C08K 5/53* | (2006.01) |
| *C08L 71/12* | (2006.01) |
| *C09D 171/12* | (2006.01) |
| *H05K 1/03* | (2006.01) |
| *C08K 5/5313* | (2006.01) |
| *C08J 5/10* | (2006.01) |

(52) U.S. Cl.
CPC .............. *C08G 65/485* (2013.01); *C08J 5/10* (2013.01); *C08J 5/24* (2013.01); *C08K 5/53* (2013.01); *C08K 5/5313* (2013.01); *C08L 71/126* (2013.01); *C09D 171/12* (2013.01); *H05K 1/0353* (2013.01); *C08J 2371/12* (2013.01); *H05K 2201/0129* (2013.01)

(58) Field of Classification Search
CPC .. C08G 65/485; C08J 5/24; C08J 5/10; C08K 5/53; C08L 71/126; C09D 171/12; H05K 1/0353
See application file for complete search history.

*Primary Examiner* — John E Uselding
(74) *Attorney, Agent, or Firm* — Muncy, Geissler, Olds & Lowe, P.C.

(57) ABSTRACT

Provided are a modified polyphenylene ether resin, a method of making the same and a resin composition. Particularly, the modified polyphenylene ether resin has a structure represented by the following formula (I), wherein R, Y, PPE, Z and c are as described in the specification. Also provided are a method of making the modified polyphenylene ether resin, a resin composition comprising the modified polyphenylene ether resin and an article made from the resin composition. Using the modified polyphenylene ether resin described above can achieve a better glass transition temperature, thermal resistance and lower (superior) thermal expansion and dielectric properties.

$$R\text{---}[\text{Y-PPE-Z}]_c \qquad (I)$$

11 Claims, 2 Drawing Sheets

MODIFIED POLYPHENYLENE ETHER RESIN, METHOD OF MAKING THE SAME AND RESIN COMPOSITION

CROSS-REFERENCE TO RELATED APPLICATIONS

This Application claims priority of China Patent Application No. 201511023931.4, filed on Dec. 30, 2015, the entirety of which is incorporated by reference herein.

BACKGROUND OF THE INVENTION

Field of the Invention

The present disclosure relates to a modified polyphenylene ether resin, a method of making the same and a resin composition.

Description of Related Art

In recent years, with the rapid development of electronics industry, electronic devices tend to become small, thin, light-weight, of high assembly density and high functionality, demanding the printed circuit board (PCB) manufacturing technology to develop toward high density wiring and multilayer configuration. Development of high density wiring of PCB enables a board to have finer patterns, miniature apertures and narrow wire spacing, and requirements for copper clad laminates (CCLs) mainly reflect on the aspects of high reliability, high humidity and heat resistance, low dielectric constant, low dielectric loss, high dimensional stability, and the like. Therefore, there is a need to find a high-performance novel printed circuit board (PCB) material of excellent dielectric properties. Polyphenylene ether (PPE) has the advantages of low dielectric constant, low dielectric loss and other prominent advantages, making it an ideal material for use in current high-frequency PCBs.

However, polyphenylene ether is a thermoplastic resin; when the temperature is above 210° C., it is easy to deform and difficult to bear welding operation of the printed circuit board above 260° C.; it has poor resistance to organic solvent (e.g. chloro-aliphatic hydrocarbons or aromatic hydrocarbons); in a manufacturing process of the printed circuit board, polyphenylene ether tends to dissolve when chloro-aliphatic hydrocarbons are used for cleaning, which causes deformation of the circuit board and weak wire attachment or fall-off. These limit its application scope, so it is necessary to modify the thermosetting property of polyphenylene ether.

Moreover, if the molecular weight of PPE is too high, the viscosity increases, the melt flowability is low and molding process is difficult; if the molecular weight of PPE resin is too low, especially when the number average molecular weight Mn<3000, the heat resistance and electrical properties are poor.

Therefore, in this field there still needs a polyphenylene ether resin of good heat resistance, good dimensional stability and dielectric properties.

SUMMARY OF THE INVENTION

A first aspect of the disclosure provides a modified polyphenylene ether resin, having a structure represented by formula (I):

wherein:

c is an integer from 3 to 12, preferably an integer from 3 to 6;

R represents a functional group with 3 to 12 phenolic hydroxyl groups, preferably with 3 to 6 phenolic hydroxyl groups; Y and R are connected via O atom of the phenolic hydroxyl groups on the R group;

Y is selected from:

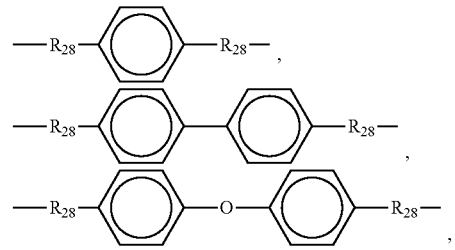

and a combination thereof;

wherein, $R_{28}$ are each independently selected from C1 to C4 alkylene, such as methylene, ethylene and the like, preferably methylene;

PPE has a structure represented by formula (II):

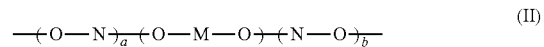

wherein M is represented by formula (III) or (IV):

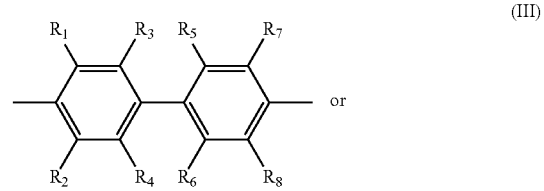

N is represented by formula (V):

wherein $R_1$, $R_2$, $R_7$ and $R_8$ are the same or different, each independently selected from halogen, C1 to C6 alkyl and phenyl, preferably C1 to C6 alkyl; $R_3$, $R_4$, $R_5$ and $R_6$ are the same or different, each independently selected from hydrogen, halogen, C1 to C6 alkyl and phenyl, preferably hydrogen or C1 to C6 alkyl; $R_9$, $R_{10}$, $R_{11}$, $R_{12}$, $R_{13}$, $R_{14}$, $R_{15}$ and $R_{16}$ are the same or different, each independently selected from halogen, C1 to C6 alkyl, phenyl and hydrogen, preferably hydrogen or C1 to C6 alkyl; A is C1 to C20 linear or branched hydrocarbyl, or is C3 to C20 cyclic hydrocarbyl, preferably C1 to C6 alkylene, such as —$CH_2$— or —$C(CH_3)_2$—; $R_{19}$ and $R_{20}$ are the same or different, each independently selected from halogen, C1 to C6 alkyl and phenyl, preferably C1 to C6 alkyl; $R_{17}$ and $R_{18}$ are the same or different, each independently selected from hydrogen, halogen, C1 to C6 alkyl and phenyl, preferably hydrogen or C1 to C6 alkyl; a and b are each independently a positive integer from 1 to 50, preferably from 1 to 40 and more preferably from 1 to 30;

Z has the following structure:

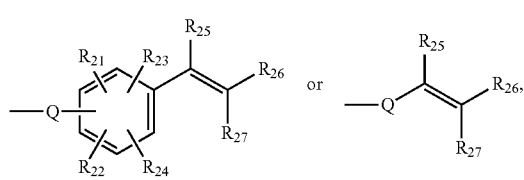

wherein $R_{26}$ and $R_{27}$ are hydrogen; $R_{21}$, $R_{22}$, $R_{23}$, $R_{24}$ and $R_{25}$ are the same or different, each independently selected from hydrogen, halogen, C1 to C6 alkyl and halogenated C1 to C6 alkyl; Q represents an organic group having at least one carbon atom, such as C1 to C6 alkylene, the organic group selectively comprising an oxygen atom, a nitrogen atom, a sulfur atom and/or a halogen atom; for example, Q can be methylene (—$CH_2$—) or carbonyl.

In some embodiments, c is an integer from 3 to 6, and R represents a functional group having 3 to 6 phenolic hydroxyl groups.

In some embodiments, c is an integer from 3 to 6, and R represents a functional group having 3 to 6 phenolic hydroxyl groups and unsubstituted on ortho- and para-positions of the phenolic hydroxyl or substituted by a non-polymerizable substituent on ortho- and para-positions of the phenolic hydroxyl.

In some embodiments, R is a group having a structure represented by formula (A), (B) or (C):

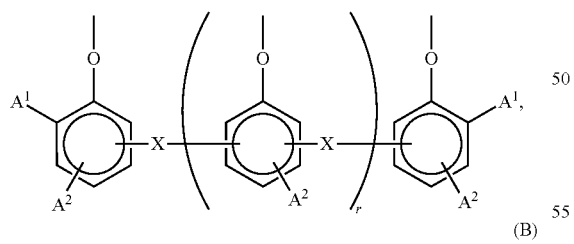

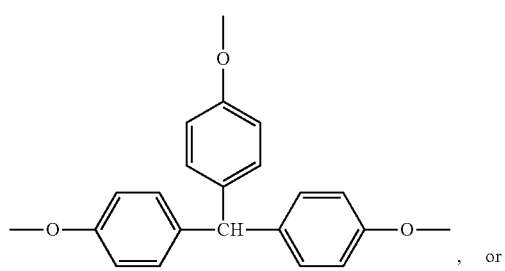

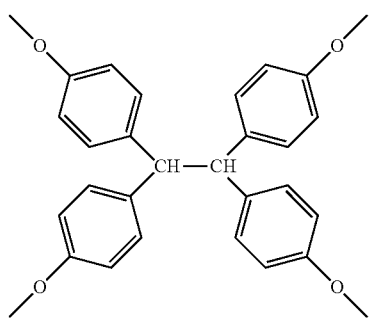

wherein $A^1$ and $A^2$ independently represent C1 to C4 linear alkyl, each X independently represents aliphatic hydrocarbyl, aralkyl or a substituted derivative thereof, an oxygen atom, a sulfur atom, sulfonyl or carbonyl; e.g., X is methylene.

r is an integer from 1 to 10, preferably an integer from 1 to 4.

In some embodiments, in formula A, X and $A^2$ are respectively connected to ortho- or meta-position of the oxygen atom.

In some embodiments, R is selected from

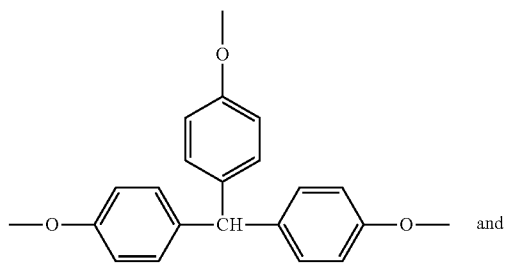

and

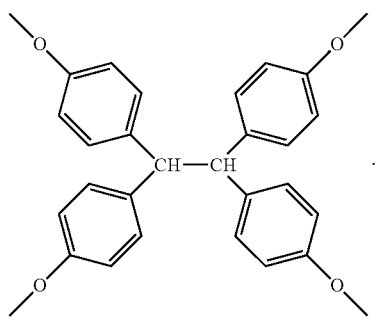

In some embodiments, c is 3 or 4.

In some embodiments, each Y is selected from

In some embodiments, each PPE is independently selected from:

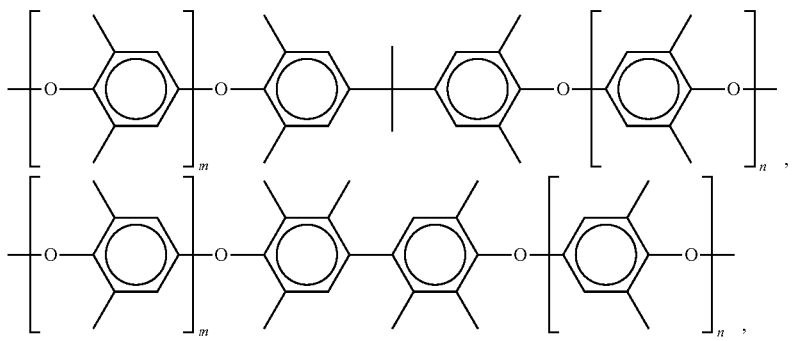

and a combination thereof, wherein m and n are each independently a positive integer from 1 to 30, preferably a positive integer from 1 to 10, more preferably a positive integer from 1 to 6.

In some embodiments, each Z is independently selected from —CH$_2$—CH=CH$_2$,

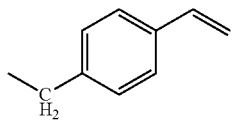

and a combination thereof.

In some embodiments, the modified polyphenylene ether is selected from

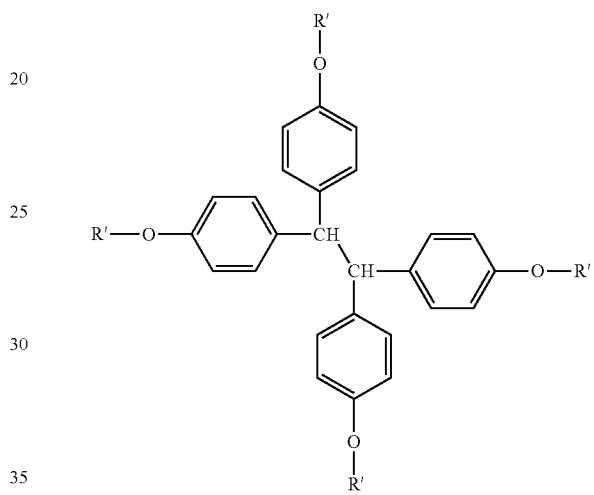

wherein each R' is the same and selected from

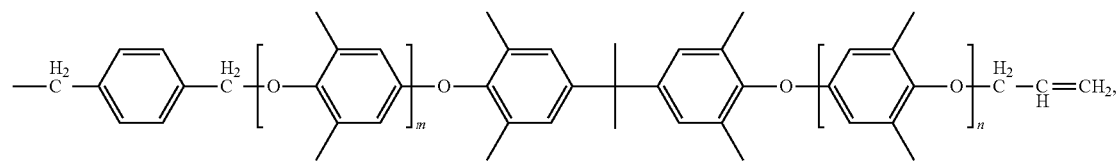

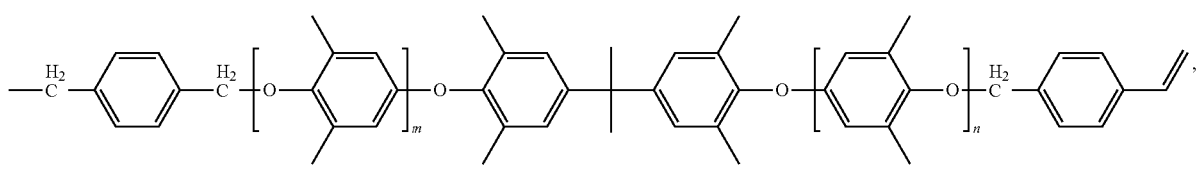

and

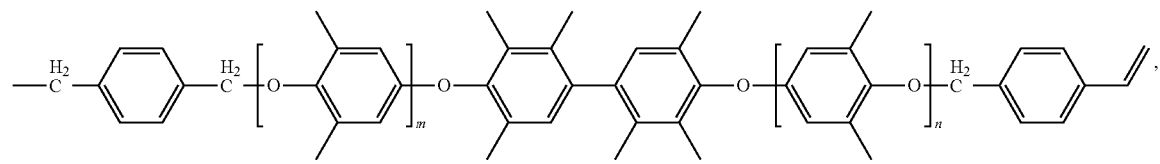

and in each formula, m and n are each independently a positive integer from 1 to 30, preferably a positive integer from 1 to 10, more preferably a positive integer from 1 to 6.

A second aspect of the present disclosure provides a modified polyphenylene ether resin preparation method, the method comprising:

(1) reacting a bis(haloalkyl) compound with a polyphenolic compound to obtain a first intermediate product;

(2) reacting the first intermediate product with dihydroxyl polyphenylene ether to obtain a second intermediate product; and (3) reacting the second intermediate product with a vinyl compound to obtain the modified polyphenylene ether resin.

In some embodiments, the bis(haloalkyl) compound is selected from

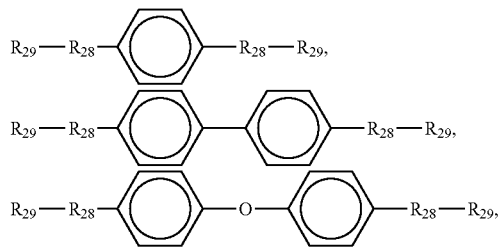

and a combination thereof;

wherein $R_{28}$ are each independently selected from C1 to C4 alkylene, such as methylene, ethylene and the like, preferably methylene; $R_{29}$ are each independently halogen.

In some embodiments, the bis(haloalkyl) compound is selected from bis(chloromethyl)benzene, bis(chloromethyl) biphenyl and bis(chloromethylphenyl)ether.

In some embodiments, the polyphenolic compound has 3 to 12 phenolic hydroxyl groups and unsubstituted on ortho- and para-positions of the phenolic hydroxyl groups or substituted by a non-polymerizable substituent (such as hydrocarbyl) on ortho- and para-positions of the phenolic hydroxyl groups.

In some embodiments, the polyphenolic compound has 3 to 6 phenolic hydroxyl groups and unsubstituted on ortho- and para-positions of the phenolic hydroxyl groups or substituted by a non-polymerizable substituent (such as hydrocarbyl) on ortho- and para-positions of the phenolic hydroxyl groups.

In some embodiments, the polyphenolic compound has the following structure:

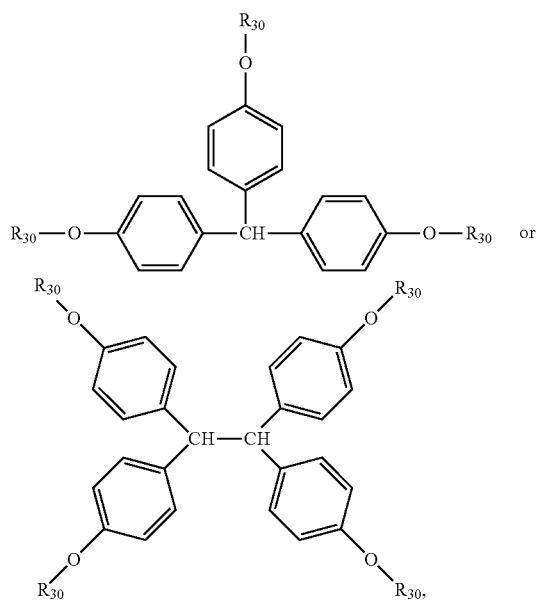

wherein $R_{30}$ are each independently selected from H.

In some embodiments, the polyphenolic compound is tetraphenol ethane.

In some embodiments, a reaction of bis(haloalkyl) compound with a polyphenolic compound occurs in the presence of a phase transfer catalyst.

In some embodiments, step (1) includes: at 20° C. to 60° C., mixing the bis(haloalkyl) compound, the polyphenolic compound, the phase transfer catalyst and the solvent to obtain a fully dissolved first mixture solution; heating the first mixture solution to 60° C. to 90° C., and stirring continuously for 1 hour to 5 hours to obtain a solution of the first intermediate product.

In some embodiments, a molar ratio of the bis(haloalkyl) compound to the polyphenolic compound is 6:1 to 1:6.

In some embodiments, a molar ratio of the phase transfer catalyst to the bis(haloalkyl) compound is 1:3 to 3:1.

In some embodiments, the amount of the solvent is 5 to 20 times the mass of the polyphenolic compound.

In some embodiments, the two terminals of the dihydroxyl polyphenylene ether are each connected with a hydroxyl group.

In some embodiments, the dihydroxyl polyphenylene ether has the following structure:

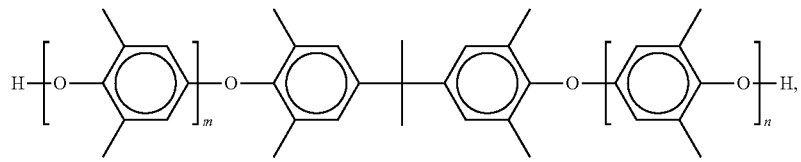

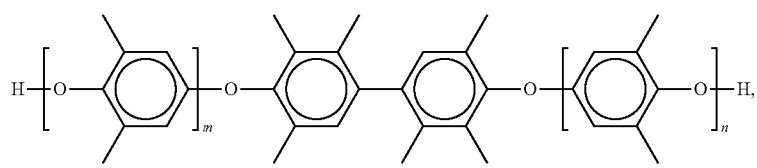

and a combination thereof, wherein m and n are each independently a positive integer from 1 to 30, preferably a positive integer from 1 to 10, more preferably a positive integer from 1 to 6.

In some embodiments, the dihydroxyl polyphenylene ether is selected from dihydroxyl-terminated bis(2,6-dimethyl) bisphenol A polyphenylene ether resin (product name: SA-90, available from Sabic) and dihydroxyl-terminated bis(2,3,6-trimethyl) biphenyl polyphenylene ether (product name: OPE, available from Mitsubishi Gas Chemical Co.).

In some embodiments, the dihydroxyl polyphenylene ether is dissolved in the same solvent used in step (1).

In some embodiments, step (2) comprises: at 30° C. to 60° C., mixing the first intermediate product with the dihydroxyl polyphenylene ether, followed by stirring at 60° C. to 90° C. for 2 to 5 hours to obtain a second intermediate product.

In some embodiments, a molar ratio of the first intermediate product to dihydroxyl polyphenylene ether is 1:6 to 6:1.

In some embodiments, the vinyl compound is selected from an aromatic compound comprising vinyl and halogen, an aliphatic compound comprising vinyl and halogen or methacrylic acid.

In some embodiments, the vinyl compound is selected from 4-chloromethyl styrene, 3-chloromethyl styrene, 2-chloromethyl styrene, methacrylic acid, chloropropene and a combination thereof. More preferably, the vinyl compound is 4-chloromethyl styrene, 3-chloromethyl styrene or 2-chloromethyl styrene.

In some embodiments, a molar ratio of the second intermediate product to the vinyl compound is 1:2 to 1:8.

In some embodiments, step (3) comprises: mixing the second intermediate product with the vinyl compound, the phase transfer catalyst and the solvent, stirring until fully dissolved and further stirring for 2 hours to 6 hours to obtain a solution of a third intermediate product.

In some embodiments, step (3) comprises: at 30° C. to 60° C., mixing the second intermediate product with the vinyl compound, the phase transfer catalyst and the solvent, stirring until fully dissolved and further stirring for 2 hours to 6 hours at 30° C. to 60° C. to obtain a solution of a third intermediate product.

In some embodiments, the method further comprises: cooling the solution of the third intermediate product to room temperature, adding an acidic solution to neutralize, then stirring with water addition and removing waste liquid and the solvent to obtain the modified polyphenylene ether resin.

In some embodiments, the acidic solution used for neutralization is selected from the following group: phosphoric acid, hydrochloric acid, sulfuric acid and acetic acid; preferably phosphoric acid.

In some embodiments, the phase transfer catalyst is selected from quaternary ammonium salts and tetrabutyl phosphorus bromide, preferably quaternary ammonium salts, more preferably tetra-n-butyl ammonium bromide.

In some embodiments, the solvent is selected from dimethyl sulfoxide, dimethylformamide, dimethylacetamide, toluene, tetrahydrofuran, xylene and a combination thereof, preferably tetrahydrofuran.

A third aspect of the present disclosure provides a resin composition which comprises the aforesaid modified polyphenylene ether resin.

In some embodiments, the resin composition comprises 100 parts by weight of the modified polyphenylene ether resin and 20 to 80 parts by weight of Flame Retardant A represented by the formula below:

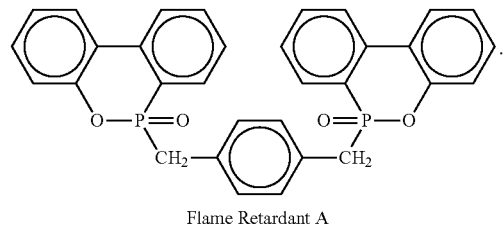

Flame Retardant A

In some embodiments, the amount of Flame Retardant A is preferably 20 to 60 parts by weight and more preferably 20 to 50 parts by weight.

In some embodiments, the resin composition further comprises at least one of a second flame retardant, inorganic filler, curing accelerator, solvent, surfactant and crosslinking agent.

In some embodiments, the resin composition further comprises other vinyl compounds and/or vinyl polymers.

In some embodiments, the other vinyl compounds and/or vinyl polymers are selected from ethylene-propylene-diene monomer rubber, butadiene-styrene copolymer, bismaleimide and a combination thereof.

In some embodiments, the resin composition comprises 5 to 50 parts by weight of butadiene-styrene copolymer and/or 14 to 50 parts by weight of bismaleimide.

The present disclosure also provides a product made from the aforesaid resin composition, comprising a resin film, a prepreg, a laminate or a printed circuit board.

DETAILED DESCRIPTION OF THE EMBODIMENTS

Figure 1:
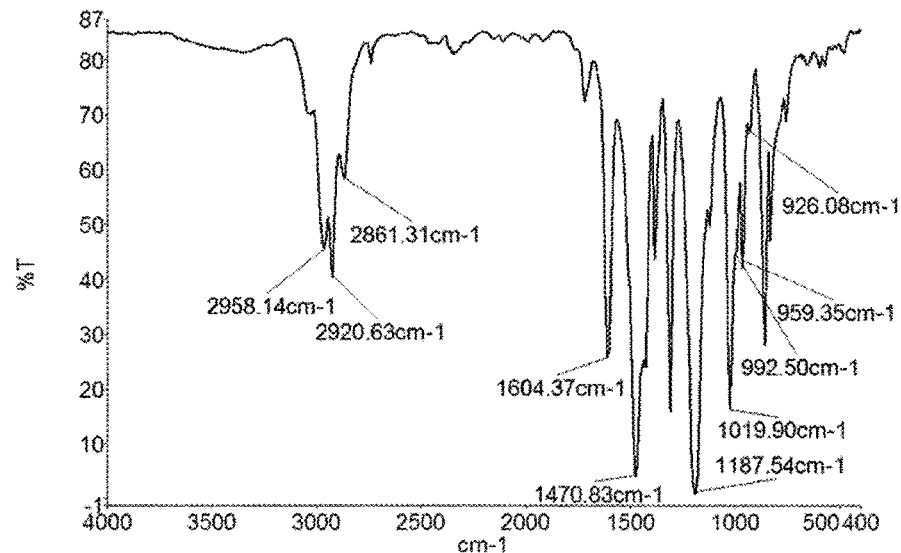
FIG. 1 illustrates an FTIR spectrogram of a product of Synthesis Example 1.

By chain extension of a low molecular weight PPE and then introducing a vinyl capping group, a thermosetting polyphenylene ether resin is prepared, which can allow a crosslinking reaction; the vinyl group is a non-polar group, which will not compromise excellent dielectric properties of PPE. Because the thermosetting polyphenylene ether resin prepared by the disclosure comprises a plurality of vinyl groups (particularly 3 or more), it may have higher crosslinking density than previously reported, thus having better heat resistance, dimensional stability and dielectric properties and the like, making it an ideal material for preparing a high-frequency printed circuit board.

In the present disclosure, halogen refers to fluorine, chlorine, bromine and iodine. "Hydrocarbyl" or "aliphatic hydrocarbyl" includes alkyl, alkenyl and alkynyl, e.g., C1 to C6 alkyl, C2 to C6 alkenyl and C2 to C6 alkynyl, preferably C1 to C4 alkyl, C2 to C4 alkenyl and C2 to C4 alkynyl; the term also includes alkylene, alkenylene and alkynylene having the specified number of carbon atom(s), such as methylene, ethylene and the like; furthermore, the term also includes linear or branched chain groups. "Aralkyl" refers to a C1 to C6, preferably C1 to C4, alkyl- or alkylene-substituted aromatic ring (e.g., benzene, naphthalene and the like), and exemplary aralkyl includes but is not limited to benzyl, phenethyl and the like. "Cyclic hydrocarbyl" refers to a group having cyclic hydrocarbyl, whose number of carbon atoms usually is 3 to 20, preferably 3 to 12, more preferably 3 to 8. Examples of cyclic hydrocarbyl include but are not limited to cycloalkyl, such as cyclopropyl, cyclobutyl, cycloheptyl, cyclohexyl and the like. Cyclic hydrocarbyl may also be a divalent group. Examples of "substituted derivatives" of aralkyl include but are not limited to:

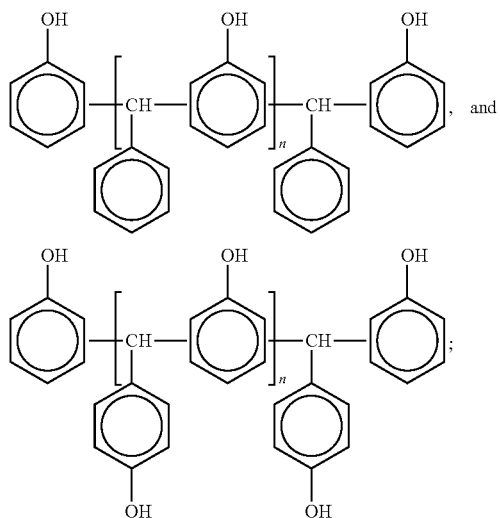

wherein n is an integer of 1 to 10.

Modified polyphenylene ether resin and preparation thereof

The present disclosure uses a polyphenolic compound having 3 to 12 phenolic hydroxyl groups preferably 3 to 6 phenolic hydroxyl groups to perform chain extension modification of a PPE of low molecular weight. More particularly, polyphenolic compounds of the present disclosure may have the following structure:

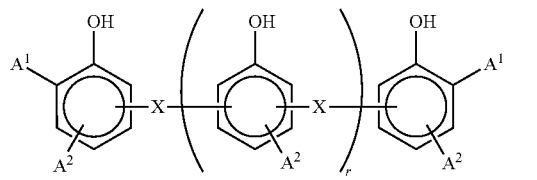

(A2)

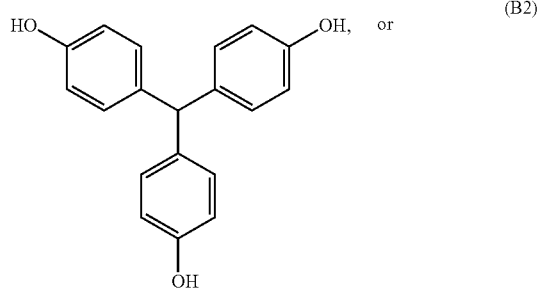

(B2)

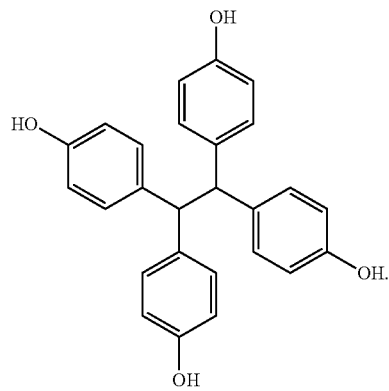

(C2)

In formula (A2), $A^1$ and $A^2$ independently represent C1 to C4 linear alkyl; each X independently represents aliphatic hydrocarbyl, aralkyl or substituted derivatives thereof, an oxygen atom, a sulfur atom, sulfonyl or carbonyl; r is an integer from 1 to 10, preferably an integer from 1 to 4;

In some embodiments, the polyphenolic compound has a structure of formula (B2) or (C2), particularly has a structure shown in formula (C2), i.e. tetraphenol ethane.

In the polyphenylene ether resin of the present disclosure, the polyphenolic compound can be connected with PPE via a bis(haloalkyl) compound. The bis(haloalkyl) compound useful in the present disclosure generally has the following structure:

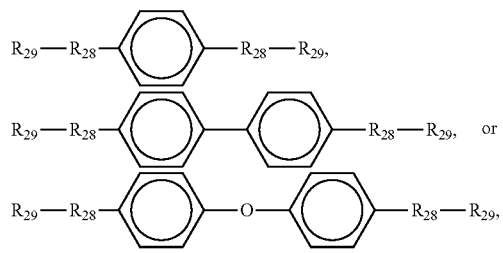

wherein $R_{28}$ are each independently selected from C1 to C4 alkylene, such as methylene, ethylene and the like, preferably methylene; $R_{29}$ are each independently halogen, preferably chlorine. After the reaction, $R_{29}$ is eliminated, while $R_{28}$ is connected with O atom in the hydroxyl group of the polyphenolic compound.

Preferred bis(haloalkyl) compounds can be bis(chloromethyl)benzene, bis(chloro-methyl)biphenyl and bis(chloromethylphenyl)ether.

A reaction between the polyphenolic compound and bis (haloalkyl) compound may be conducted in a solvent in the presence of a phase transfer catalyst. For example, at 20° C. to 60° C. (e.g., at 20° C. to 35° C.), mixing the bis(haloalkyl) compound, the polyphenolic compound, the phase transfer catalyst and the solvent to obtain a fully dissolved first mixture solution; heating the first mixture solution to 60° C. to 90° C. (e.g. 65° C. to 85° C.), and stirring continuously for 1 hour to 5 hours to obtain a solution of the first intermediate product. A molar ratio of the bis(haloalkyl) compound to the polyphenolic compound is 6:1 to 1:6, such as 5:1 to 1:5, or 4:1 to 1:4, or 3:1 to 1:3. A molar ratio of the phase transfer catalyst to the bis(haloalkyl) compound is 1:3 to 3:1, for example 1:2 to 2:1. The amount of the solvent is 5 to 20 times, for example 8 to 20 times the mass of the polyphenolic compound.

After completion of the reaction, the solution of the first intermediate product is reacted with dihydroxyl polyphenylene ether. The dihydroxyl polyphenylene ether useful in the present disclosure has a structure shown in formula (II-2) below:

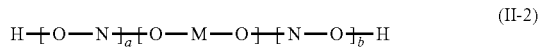
(II-2)

are the same or different, each independently selected from halogen, C1 to C6 alkyl, phenyl and hydrogen; A is C1 to C20 linear or branched hydrocarbyl, or is C3 to C20 cyclic hydrocarbyl, preferably C1 to C6 alkylene, such as —$CH_2$— or —$C(CH_3)_2$7, $R_{19}$ and $R_{20}$ are the same or different, each independently selected from halogen, C1 to C6 alkyl and phenyl; $R_{17}$ and $R_{18}$ are the same or different, each independently selected from hydrogen, halogen, C1 to C6 alkyl and phenyl; a and b are each independently a positive integer from 1 to 50, preferably from 1 to 40, more preferably from 1 to 30.

The preferred dihydroxyl polyphenylene ether has the following structure:

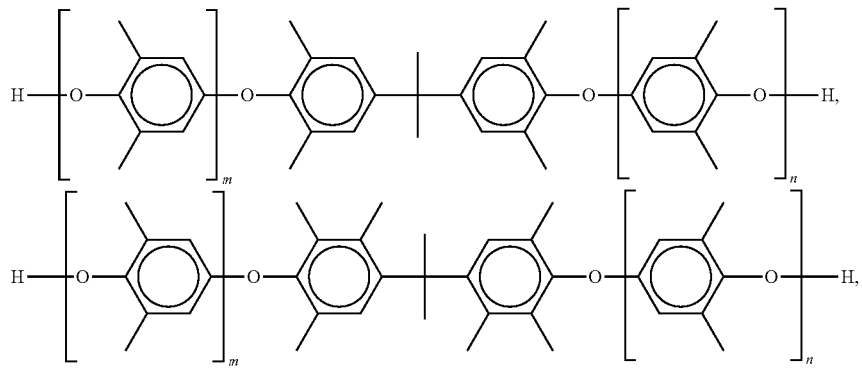

wherein M is represented by formula (III) or (IV):

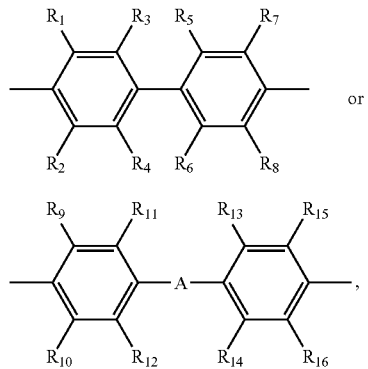
(III)

or (IV)

N is represented by formula (V):

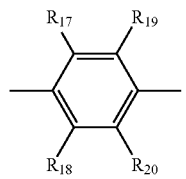
(V)

wherein $R_1$, $R_2$, $R_7$ and $R_8$ are the same or different, each independently selected from halogen, C1 to C6 alkyl and phenyl; $R_3$, $R_4$, $R_5$ and $R_6$ are the same or different, each independently selected from hydrogen, halogen, C1 to C6 alkyl and phenyl; $R_9$, $R_{10}$, $R_{11}$, $R_{12}$, $R_{13}$, $R_{14}$, $R_{15}$ and $R_{16}$ and a combination thereof, wherein m and n are each independently a positive integer from 1 to 30, preferably a positive integer from 1 to 10, more preferably a positive integer from 1 to 6.

In some embodiments, dihydroxyl-terminated bis(2,6-dimethyl)bisphenol A polyphenylene ether resin or dihydroxyl-terminated bis(2,3,6-trimethyl)biphenyl polyphenylene ether is used to prepare the polyphenylene ether resin of the disclosure.

Generally, the first intermediate product is mixed with the dihydroxyl polyphenylene ether at 30° C. to 60° C. (e.g. 30° C. to 50° C.), and then the mixture is stirred at 60° C. to 90° C. (e.g. 65° C. to 85° C.) to react for 2 to 5 hours, so as to obtain a second intermediate product. Generally, a molar ratio of the first intermediate product and the dihydroxyl polyphenylene ether is 1:6 to 6:1, for example 1:4 to 4:1.

Generally, the dihydroxyl polyphenylene ether is dissolved in the same solvent as the one used when forming the first intermediate product, and then reacted with the first intermediate product. A mass ratio between the dihydroxyl polyphenylene ether and the solvent is not particularly limited and, for example, may be 1:3 to 3:1.

Later, the second intermediate product is reacted with a vinyl compound to obtain the modified polyphenylene ether resin.

The vinyl compound useful in the disclosure is selected from an aromatic compound comprising vinyl and halogen, an aliphatic compound comprising vinyl and halogen or methacrylic acid. In some embodiments, the vinyl compound is selected from 4-chloromethyl styrene, 3-chloromethyl styrene, 2-chloromethyl styrene, methacrylic acid, chloropropene and a combination thereof. More preferably, the vinyl compound is 4-chloromethyl styrene, 3-chloromethyl styrene or 2-chloromethyl styrene.

Generally, the second intermediate product, the vinyl compound, the phase transfer catalyst and the solvent are mixed at 30° C. to 60° C. (e.g. 30° C. to 50° C.), and the mixture is stirred until fully dissolved and further stirred continuously for 2 hours to 6 hours at 60° C. to 90° C. (e.g. 65° C. to 85° C.) to obtain a solution of a third intermediate product. A molar ratio of the second intermediate product to the vinyl compound is 1:2 to 1:8, for example 1:2 to 1:5. Usually the vinyl compound is provided in the form of a solution of the vinyl compound and a solvent, and the solvent is generally the same as the one used in the previous steps. A mass ratio between the vinyl compound and the solvent is not particularly limited and, for example, may be 1:2 to 1:5.

Cool the solution of the third intermediate product to room temperature, add an acidic solution to neutralize the solution of the third intermediate product, stir with water addition and then remove waste liquid and solvent to obtain the modified polyphenylene ether resin of the disclosure.

The acidic solution as following may be used for neutralization: phosphoric acid, hydrochloric acid, sulfuric acid or acetic acid, preferably phosphoric acid.

In the above steps, the phase transfer catalyst is selected from quaternary ammonium salts and tetrabutyl phosphorus bromide, preferably quaternary ammonium salts, more preferably tetra-n-butyl ammonium bromide. The solvent is selected from: dimethyl sulfoxide, dimethylformamide, dimethylacetamide, toluene, tetrahydrofuran, xylene and a combination thereof, preferably tetrahydrofuran.

The present disclosure therefore includes the modified polyphenylene ether resin prepared by the method of the present disclosure. Specifically, the present disclosure provides a modified polyphenylene ether resin, which is polymerized from the polyphenolic compound, bis(haloalkyl) compound, PPE and vinyl compound described herein. As mentioned above, the polymerization can be conducted in the presence of the phase transfer catalyst and solvent. A material ratio (molar ratio) of the bis(haloalkyl) compound to the polyphenolic compound may be 6:1 to 1:6, such as 5:1 to 1:5, or 4:1 to 1:4, or 3:1 to 1:3. A material ratio (molar ratio) of the polyphenolic compound to dihydroxyl polyphenylene ether may be 1:6 to 6:1, for example 1:4 to 4:1. A material ratio (molar ratio) of the polyphenolic compound to the vinyl compound may be 1:2 to 1:8, for example 1:2 to 1:5.

More preferably, the modified polyphenylene ether resin of the disclosure has a structure represented by the following formula (I):

 (I)

wherein R, Y, PPE, Z and c are as defined above.

In preferred embodiments, R is selected from formula (C) described herein; Y is selected from:

PPE is selected from:

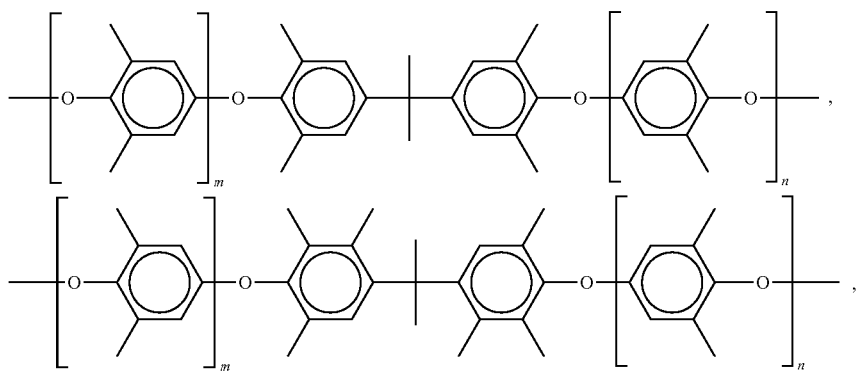

and a combination thereof, wherein m and n are each independently a positive integer from 1 to 30, preferably a positive integer from 1 to 10, and more preferably a positive integer from 1 to 6;

and Z is selected from —$CH_2$—CH=$CH_2$ and

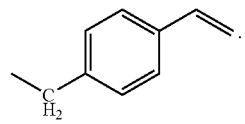

Resin Composition

The present disclosure provides a resin composition containing the aforesaid modified polyphenylene ether resin.

In one embodiment, the resin composition comprises 100 parts by weight of the modified polyphenylene ether resin and 20 to 80 parts by weight of a flame retardant, which has a structure shown below ("Flame Retardant A"):

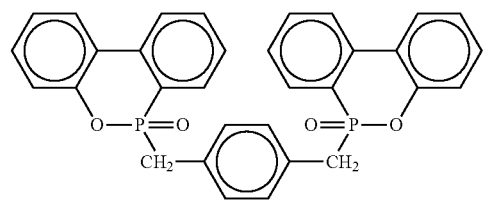

The amount of Flame Retardant A is preferably 20 to 60 parts by weight and more preferably 20 to 50 parts by weight.

The resin composition can further comprise a vinyl compound and/or a vinyl polymer. The vinyl compound and/or vinyl polymer may be selected from ethylene-propylene-diene monomer rubber, butadiene-styrene copolymer, bismaleimide and a combination thereof.

Preferably, the resin composition according to the present disclosure contains 5 to 50 parts by weight of a butadiene-styrene copolymer; and/or 14 to 50 parts by weight of bismaleimide.

The modified polyphenylene ether resin composition according to the present disclosure may further comprise any one or more of inorganic filler, curing accelerator, solvent, surfactant, and crosslinking agent.

The resin composition according to the present disclosure may further comprise a second flame retardant in addition to Flame Retardant A. The second flame retardant comprises but not limited to a compound with flame retardant elements or flame retardant functional groups, such as a phosphorous-containing compound, a nitrogen-containing compound or a bromine-containing compound. The phosphorous-containing compound may be at least one of the following compounds, but not limited thereto: bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri(chloroisopropyl) phosphate, trimethyl phosphate (TMP), dimethyl methyl phosphonate (DMMP), resorcinol bis(dixylenyl phosphate) (RDXP, such as PX-200, commercially available from Daihachi Chemical Industry Co. Ltd.), 4,4'-biphenyl bis (phosphodiesterase-(2,6-dimethylphenyl)ester) (such as PX-202, commercially available from Daihachi Chemical Industry Co. Ltd.), phosphazene (such as SPB-100, commercially available from Otsuka Chemical Co. Ltd.), m-phenylene methylphosphonate (PMP), melamine polyphosphate, 9,10-dihydro-9-oxa-10-phosphaphenanthrene-10-oxide (DOPO), DOPO-containing epoxy resin, DOPO-HQ-containing epoxy resin, diphenyl phosphine oxide (DPPO) compound, diphenylphosphine oxide derivatives, DOPO-containing phenolic resin, e.g. DOPO-HQ, DOPO-containing phenolic novolac (DOPO-PN), and DOPO-containing bisphenol novolac resin (DOPO-BPN), wherein DOPO-BPN may be bisphenol novolac resin, such as DOPO-BPAN, DOPO-BPFN, and DOPO-BPSN, etc. The nitrogen-containing compound may be selected from amino triazine novolac (ATN), melamine cyanurate, trihydroxyl ethyl isocyanurate and a combination thereof. The bromine-containing compound may be at least one of the following compounds, but not limited thereto: tetrabromobisphenol A (TBBPA), tetrabromocyclohexane, hexabromocyclodecane and 2,4,6-tris (tribromophenoxy)-1,3,5-triazine and decabromodiphenyl ethane.

Preferably, to per 100 parts by weight of the modified polyphenylene ether resin, the amount of the second flame retardant is 10 to 90 parts by weight.

Inorganic fillers suitable for the present disclosure may be any inorganic filler known in the art useful for the polyphenylene ether resin and may comprise without limitation silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride, calcined kaolin and a combination thereof. Preferably, the inorganic filler may be spherical, fibrous, plate-like, particulate, sheet-like or whisker-like in shape and can be optionally pretreated by a silane coupling agent, such as silane or siloxane compound. Preferably, the inorganic filler has a particle size of 100 μm or less, preferably 1 nm to 20 μm; more preferably, the inorganic filler is nano-scaled, having a particle size between 10 nm to 1 μm.

To per 100 parts by weight of the aforesaid modified polyphenylene ether resin, the amount of the inorganic filler may be 50 to 100 parts by weight, generally 50 to 80 parts by weight.

Curing accelerators suitable for the present disclosure may be any known curing accelerator useful for preparing resins, particularly polyphenylene ether resins, and may comprise without limitation catalysts such as Lewis base or Lewis acid. The Lewis base may comprise any one or more of imidazole, boron trifluoride-amine complex, ethyltriphenyl phosphonium chloride, 2-methylimidazole (2MI), 2-phenylimidazole (2PZ), 2-ethyl-4-methylimidazole (2E4MI), triphenylphosphine (TPP) and 4-dimethylamino pyridine (DMAP). Lewis acid may comprise metal salt compounds, such as manganese, iron, cobalt, nickel, copper, zinc and other metal salt compounds, such as zinc octoate, cobalt octoate and other metal catalysts. Preferably, the curing accelerator comprises a peroxide capable of producing free radicals, including but not limited to dicumyl peroxide, tert-butyl peroxybenzoate, and di(tert-butylperoxyisopropyl) benzene, more preferably di(tert-butylperoxyisopropyl) benzene. To per 100 parts by weight of the aforesaid modified polyphenylene ether, the amount of the curing accelerator may be 0.5 to 5 parts by weight.

Solvents suitable for the present disclosure may be any known solvent useful for preparing resins, particularly polyphenylene ether resins, and may comprise without limitation methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof. To per 100 parts by weight of the aforesaid modified polyphenylene ether resin, the amount of the solvent may be 50 to 150 parts by weight, such as 60 to 130 parts by weight and 80 to 150 parts by weight.

Surfactants suitable for the present disclosure may be any known surfactant useful for preparing resins, particularly polyphenylene ether resins, and may comprise without limitation silane compounds or siloxane compounds. To per 100 parts by weight of the aforesaid modified polyphenylene ether resin, the amount of the surfactant may be 0.1 to 10 parts by weight.

Crosslinking agents suitable for the present disclosure may be any known crosslinking agent useful for preparing resins, particularly polyphenylene ether resins, and may comprise without limitation olefin polymer, cyanate, isocyanate, cyanurate, isocyanurate, maleimide, toughener and a combination thereof.

Resin Product

The present disclosure provides a resin product. Specifically, the resin product may be a prepreg, which comprises a reinforcement material and the above-mentioned resin composition adhered onto the reinforcement material after impregnation and heated at high temperature to a semi-cured state. A baking temperature for making a prepreg is between 80° C. and 170° C.

The reinforcement material may be fiber material, woven fabric, or non-woven fabric, such as a fiberglass fabric, which is useful for increasing the mechanical strength of the prepreg. Preferably, the reinforcement material may be optionally pre-treated by a saline coupling agent. The resin product may also be a resin film, which is obtained by curing the resin composition such as by baking and heating. The resin composition can be selectively coated on a polyethylene terephthalate film (PET film), a polyimide film (PI film) or a resin coated copper (RCC), followed by baking and heating to cure the resin composition so as to form the resin film.

Moreover, the resin product may also be a laminate, which comprises two metal foils and an insulation layer arranged between the metal foils. The insulation layer may be formed by subjecting the resin composition to a high temperature (150 to 230° C.) and high pressure (200 to 450 psi) condition to cure it. The insulation layer may be the aforesaid prepreg or resin film. The metal foil may comprise copper, aluminum, nickel, platinum, silver, gold or an alloy thereof. Copper foil is an example of the metal foil.

Preferably, the laminate is a copper clad laminate (CCL). Preferably, the laminate may be subject to trace formation processes to provide a printed circuit board.

The resin product made by using the modified polyphenylene ether resin or its prepolymer according to the present disclosure may ensure better thermal resistance (Tg, T288, S/D), dielectric properties (Dk, Df), flame retardancy and lower thermal expansion. Accordingly, the resin product, such as prepreg, laminate or printed circuit board, is suitable for use in electronic products for high speed and high frequency signal transmission to further improve the reliability, thermal resistance and dimensional stability of the electronic products.

The present disclosure is further described in conjunction with the embodiments and examples below. It is understood that these embodiments and examples are merely exemplary without limiting the scope of the present disclosure. Methods, reagents and conditions employed therein, unless specified otherwise, are known to those skilled in the art.

Chemical reagents used in the examples and comparative examples are listed below.

1. SA-9000: methacrylate-terminated bisphenol A polyphenylene ether resin, available from Sabic.
2. OPE-2st 2200: vinylbenzyl-terminated biphenyl polyphenylene ether, available from Mitsubishi Gas Chemical Co., Inc.
3. SPB-100: phosphazene flame retardant, available from Otsuka Chemical Co., Ltd.
4. PX-202: 4,4'-biphenyl bis(phosphodiesterase-(2,6-dimethylphenyl)ester), available from Daihachi Chemical Industry Co. Ltd.
5. XZ92741: hydroxyl-containing phosphorous flame retardant, available from Dow Chemical Company.
6. TPN1: tetraphenol ethane, available from Nan Ya Plastics Corp.
7. BMI-70: bis(3-ethyl-5-methyl-4-maleimido phenyl) methane, available from KI Chemical.
8. 25B: 2,5-dimethyl-2,5-di(tert-butylperoxy)-3-hexyne, available from NOF Corp. 9. SC 2050 SJ: silica, available from Adamtech.

10. trilene 67: liquid state ethylene-propylene-diene monomer rubber, available from Lion Copolymer.

11. Ricon 100: butadiene-styrene copolymer, available from Cray Valley.

12. D-1118: butadiene-styrene copolymer, available from Kraton Polymers.

13. SA-90: dihydroxyl bis(2,6-dimethyl) bisphenol A polyphenylene ether resin, available from Sabic.

14. OPE: dihydroxyl-terminated bis(2,3,6-trimethyl) biphenyl polyphenylene ether, available from Mitsubishi Gas Chemical Co., Inc.

Synthesis Example 1

To a four-necked flask with a mechanical stirring and condensing reflux apparatus, 7 g of p-xylylene dichloride, 30 g of tetrahydrofuran, 4 g of 40% NaOH solution and 4 g of tetra-n-butylammonium bromide are sequentially added, and a mixed solution of 4 g of tetraphenol ethane and 30 g of tetrahydrofuran is slowly added dropwise with stirring at room temperature. React at 75° C. for 2 h after addition is completed. Add dropwise a mixed solution of 64 g of PPO and 128 g of tetrahydrofuran after cooling to 40° C., and continue to react at 75° C. for 3 h after addition is completed. Cool to 40° C. or lower, and a mixed solution of 6 g of bromopropene and 20 g of tetrahydrofuran is added dropwise slowly, and continue to react at 75° C. for 4 h after the addition is completed. Cool to room temperature after the reaction is completed, add dilute phosphoric acid solution to adjust PH≈7, and stand still to separate the upper layer as an organic layer. The organic layer is slowly added dropwise to a rapidly stirred industrial ethanol to precipitate a solid product; the solid product is suction filtered, washed with water and dried to give a product as light yellow powder. The product has a structure of:

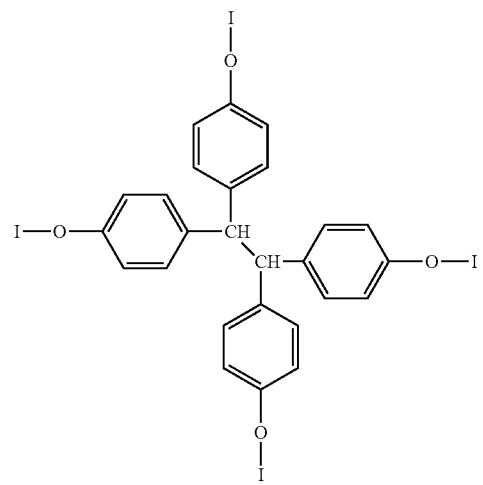 [SMILES: IOc1ccc(C(c2ccc(OI)cc2)C(c2ccc(OI)cc2)c2ccc(OI)cc2)cc1]

wherein I is:

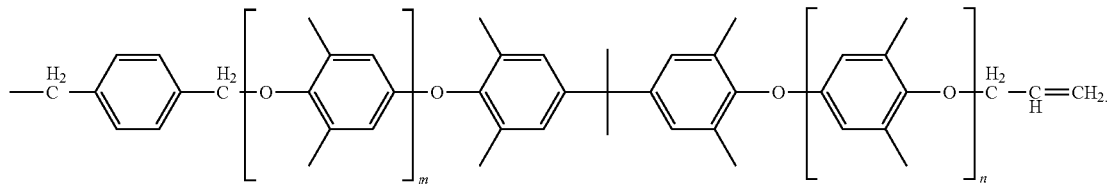

An FTIR spectrogram of the product is as shown in FIG. 1, wherein allyl carbon-carbon double bond characteristic peaks (C=C) are at 926.08 cm$^{-1}$ and 959.35 cm$^{-1}$, benzene ring skeleton vibration characteristic absorption peaks are at 1604.37 cm$^{-1}$ and 1471.83 cm$^{-1}$, a C—O stretching vibration absorption peak (C—O) is at 1187.54 cm$^{-1}$, and a C—O—C ether linkage stretching vibration absorption peak (C—O—C) is at 1019.90 cm$^{-1}$. Methylene stretching vibration absorption peaks are at 2920.63 cm$^{-1}$ and 2861.31 cm$^{-1}$, and a methyl stretching vibration absorption peak is at 2958.14 cm$^{-1}$.

Synthesis Example 2

To a four-necked flask with a mechanical stirring and condensing reflux apparatus, 7 g of p-xylylene dichloride, 30 g of tetrahydrofuran, 4 g of 40% NaOH solution and 4 g of tetra-n-butylammonium bromide are sequentially added, and a mixed solution of 4 g of tetraphenol ethane and 30 g of tetrahydrofuran is slowly added dropwise with stirring at room temperature. React at 75° C. for 2 h after the addition is completed. Add dropwise a mixed solution of 64 g of PPO (SA-90) and 128 g of tetrahydrofuran after cooling to 40° C., and continue to react at 75° C. for 3 h after the addition is completed. Cool to 40° C. or lower, and a mixed solution of 6.12 g of p-chloromethyl styrene and 20 g of tetrahydrofuran is added dropwise slowly, continue to react at 75° C. for 4 h after the addition is completed, cool to room temperature after the reaction is completed, add dilute phosphoric acid solution to adjust PH≈7, and stand still to separate the upper layer as an organic layer. The organic layer is slowly added dropwise to a rapidly stirred industrial ethanol to precipitate a solid product; the solid product is suction filtered, washed with water and dried to give a product as light yellow powder, i.e. tetra-functional modified vinylbenzyl polyphenylene ether (Compound A), which has the following structure:

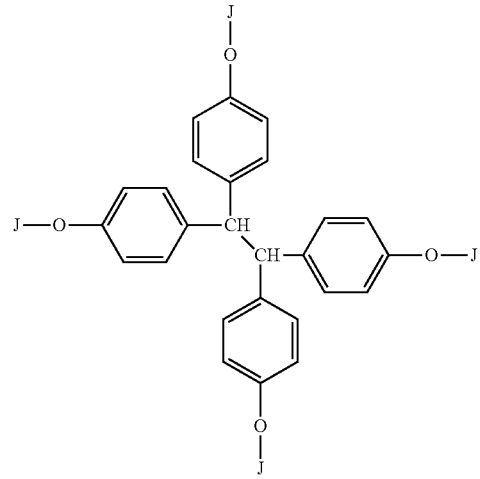

wherein J is

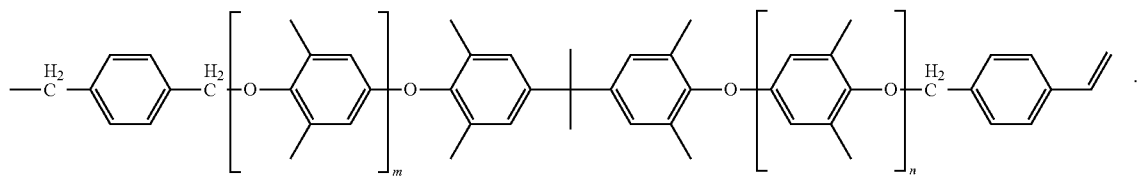

Figure 2:
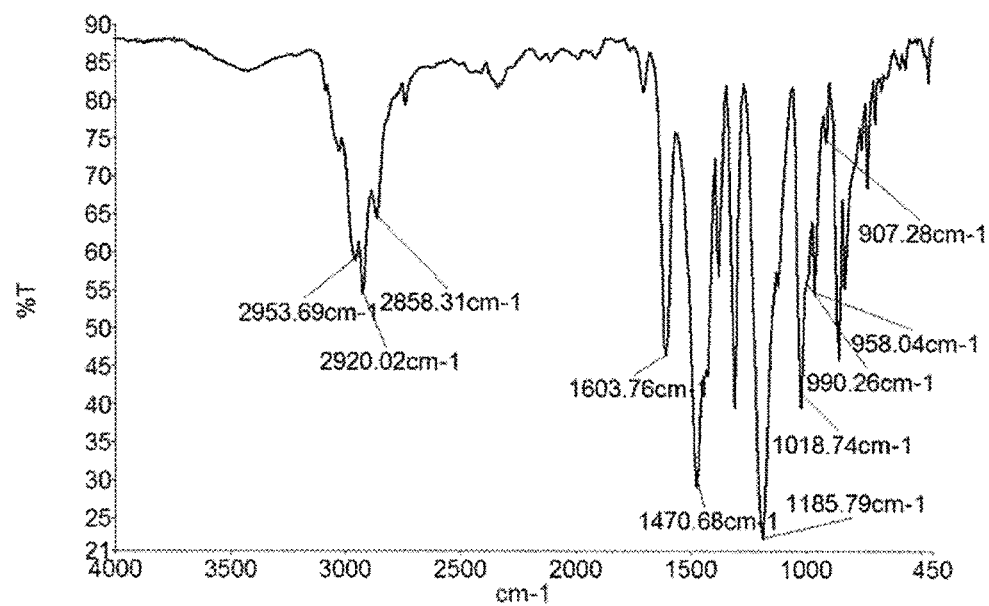
FIG. 2 illustrates an FTIR spectrogram of a product of Synthesis Example 2.

An FTIR spectrogram of the product is as shown in FIG. 2.

Synthesis Example 3

To a four-necked flask with a mechanical stirring and condensing reflux apparatus, 7 g of p-xylylene dichloride, 30 g of tetrahydrofuran, 4 g of 40% NaOH solution and 4 g of tetra-n-butylammonium bromide are sequentially added, and a mixed solution of 4 g of tetraphenol ethane and 30 g of tetrahydrofuran is slowly added dropwise with stirring at room temperature. React at 75° C. for 2 h after the addition is completed. Add dropwise a mixed solution of 64 g of PPO (OPE) and 128 g of tetrahydrofuran after cooling to 40° C., and continue to react at 75° C. for 3 h after the addition is completed. Cool to 40° C. or lower, and a mixed solution of 6.12 g of p-chloromethyl styrene and 20 g of tetrahydrofuran is added dropwise slowly; continue to react at 75° C. for 4 h after the addition is completed, cool to room temperature after the reaction is completed, add dilute phosphoric acid solution to adjust PH≈7, and stand still to separate the upper layer as an organic layer. The organic layer is slowly added dropwise to a rapidly stirred industrial ethanol to precipitate a solid product; the solid product is suction filtered, washed with water and dried to give a product as light yellow powder, having the following structure:

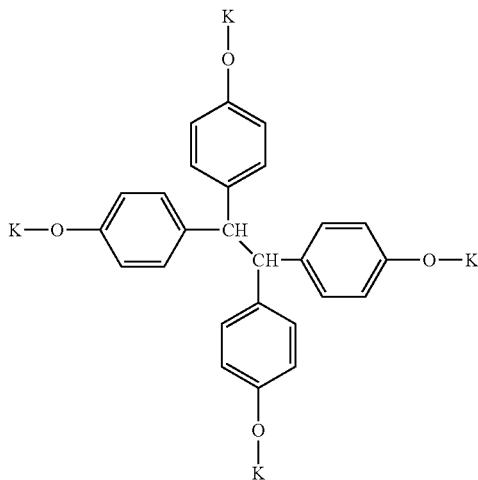

wherein K is

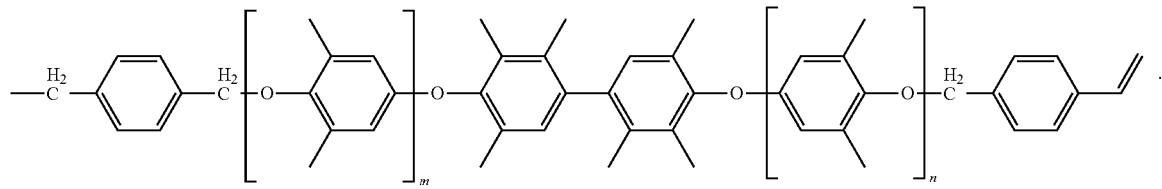

Synthetic Example 4: Preparation of Flame Retardant A

A mixture of 216 g of DOPO (9,10-dihydro-9-oxa-10-phosphaphenanthrene-10-oxide), 90 g of dichloro-p-xylene and 1200 g of 1,2-dichlorobenzene are stirred at 160° C. under nitrogen atmosphere for 24 hours, cooled to room temperature and filtered. The resulting filtered cake is dried under vacuum at 120° C. for 6 hours to obtain Flame Retardant A represented by the following formula as white powder, wherein the phosphorus content in Compound A is about 11%.

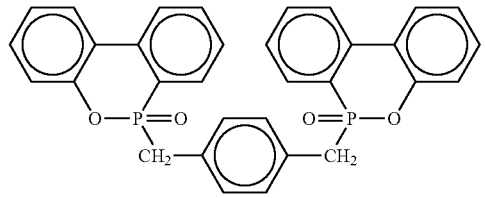

Figure 3:
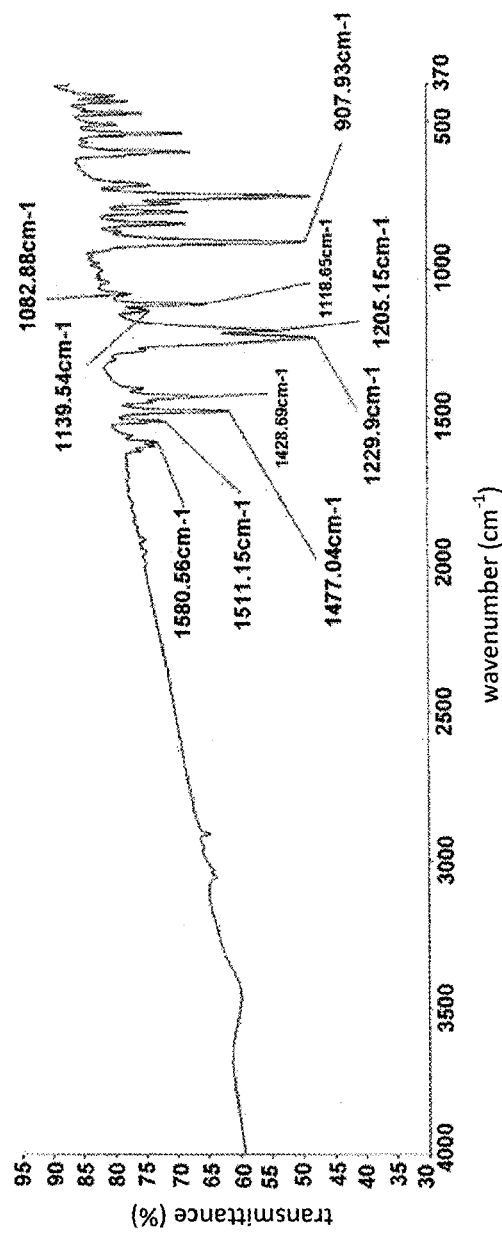
FIG. 3 illustrates an FTIR spectrogram of a product of Synthesis Example 4.

The resulting Flame Retardant A is analyzed by Fourier transform infrared spectroscopy (FTIR), and the result is shown in FIG. 3. FTIR absorption peak appears at 1594 cm$^{-1}$ (P-Ph), 1205 cm$^{-1}$ (P=O) and 908 cm$^{-1}$ (P—O-Ph); determined by FTIR analysis results, the resulting product is a phosphorus-containing flame retardant represented by the above formula.

EXAMPLES

1. Prepregs Preparation Using Resin Compositions Enumerated in Tables 1 to 3

Resin compositions of E1 to E14 and C1 to C11 were well mixed in a stirred tank individually and then placed in an impregnation tank, and fiberglass fabrics (2116 E-glass fabrics, available from Nan Ya Plastics Corp.) were individually passed through the impregnation tank to impregnate the fiberglass fabrics with the resin compositions, followed by heating and baking at 150° C. to a semi-cured state to obtain prepregs. The thickness of each prepreg is 0.127 μm, and the resin content of each prepreg is about 55%.

2. Copper-Free Laminate Preparation (1) Copper-Free Laminates (Four-Layer)

The four aforesaid prepregs were superimposed and placed between the two 18 μm thickness copper foils and subject to a lamination process under vacuum at 210° C. for 2 hours to form a copper clad laminate (CCL), in which the four prepregs were cured to form the insulation layers between the two copper foils. The resin content of the insulation layers is about 55%.

Each copper clad laminate was etched to remove the copper foils at both sides and obtain a copper-free laminate (four-layer), wherein the copper-free laminate (four-layer) is from four prepregs laminated together and has a resin content of about 55%.

(2) Copper-Free Laminates (Two-Layer)

The two aforesaid prepregs were superimposed and placed between the two 18 μm thickness copper foils and subject to a lamination process under vacuum at 210° C. for 2 hours to form a copper clad laminate (two-layer).

Next, each copper clad laminate was etched to remove the copper foils at both sides and obtain a copper-free laminate (two-layer), wherein the copper-free laminate (two-layer) is from two prepregs laminated together and has a resin content of about 55%.

3. Test Methods and Property Measurements were Performed Pursuant to the Following Procedures:

(1) Glass Transition Temperature (Tg)

In the glass transition temperature test, each copper-free laminate (four-layer) is used as a specimen, which is tested by a dynamic thermomechanical analyzer (DMA) by reference to the procedure described in IPC-TM-650 2.4.24.4.

(2) Thermal Expansion

In the thermal expansion test, each aforesaid copper-free laminate (four-layer) is used as the specimen. The specimen is heated from 50° C. to 260° C. so as to measure the thermal expansion represented in % of each specimen using a thermal mechanical analyzer (TMA) by reference to the procedure described in IPC-TM-650 2.4.24.5. Lower thermal expansion is more preferred.

(3) Thermal Resistance T288

In the thermal resistance test, each aforesaid copper clad laminate (four-layer, cut to 6.5 mm×6.5 mm) is used as the specimen, and a thermal mechanical analyzer is used to measure the time to delamination of the copper clad laminate at a constant temperature 288° C. by reference to the procedure described in IPC-TM-650 2.4.24.1. Longer time to delamination represents higher thermal resistance of the copper clad laminate made from the resin composition.

(4) Solder Dipping Thermal Resistance (S/D)

In the solder dipping test, each aforesaid copper clad laminate (four-layer) is used as the specimen, which is subject to tests and measurements by reference to the procedure described in IPC-TM-650 2.4.23, and the specimen is immersed in a solder pot of a constant temperature of 288° C. for 10 seconds and then taken out, immersed in the solder pot again for 10 seconds and then taken out, operated repeatedly to test the number of cycles to delamination of each specimen.

(5) Dielectric Constant and Dielectric Loss

In dielectric constant and dielectric loss measurements, each aforesaid copper-free laminate (two-layer) is used as the specimen. A microwave dielectrometer commercially available from AET Inc. is used by reference to the procedure described in JIS C2565 to measure dielectric constant and dissipation factor under room temperature at 10 GHz frequency. Lower dielectric constant and lower dielectric loss represent a better dielectric property of the specimen. A difference less than 0.05 in Dk indicates no significant difference in dielectric constant of laminates, and a difference greater than 0.05 in Dk indicates significant difference in dielectric constant of laminates. A difference less than 0.0005 in Df indicates no significant difference in dielectric loss of laminates, and a difference greater than 0.0005 in Df indicates significant difference in dielectric loss of laminates.

(6) Flame Retardancy

In the flame retardancy test, each aforesaid copper-free laminate (four-layer, 125 mm×13 mm) is used as the specimen, and the test is performed by reference to the UL94 standard. The flame retardancy result is expressed as V-0, V-1, and V-2 levels, wherein V-0 represents a flame retardancy superior to V-1, V-1 is superior to V-2, and burn out represents the worst flame retardancy.

4. Results

Comparison between E1 and C1 shows that the tetra-functional modified vinylbenzyl polyphenylene ether resin in the present disclosure, compared with conventional vinylbenzyl polyphenylene ether, may achieve better glass transition temperature and thermal resistance and lower (better) thermal expansion and dielectric properties.

The experimental data indicates that 100 parts by weight of the tetra-functional modified vinylbenzyl polyphenylene ether resin of the disclosure used in conjunction with 20 to 80 parts by weight of Flame Retardant A ensures better thermal resistance (Tg, T288, S/D), lower thermal expansion and dielectric properties (Dk, Df), and a flame retardancy of V-0 of the laminate. Beyond this range, the heat resistance of the laminate will be deteriorated (C7), dielectric properties will become worse (C7), and the flame retardancy cannot meet the requirements (C8). Using methacrylate-terminated polyphenylene ether in the conventional art (C4 to C6), the heat resistance and thermal expansion of the laminate become worse. Using other flame retardants (C9 to C11), the heat resistance, thermal expansion and dielectric properties of the laminate all become worse.

TABLE 1

| Component | Type | Example | E1 | E2 | C1 | C2 | C3 | C4 | C5 | C6 |
|---|---|---|---|---|---|---|---|---|---|---|
| flame retardant | high melting point phosphorous flame retardant | Flame Retardant A | 25 | 25 | 25 | | | 25 | | 25 |
| | phosphazene flame retardant | SPB-100 | | | | | | | 25 | |
| | condensed phosphate | PX-202 | | | | 25 | | | | |
| | hydroxyl-containing phosphorous flame retardant | XZ92741 | | | | | 25 | | | |
| vinyl compound | tetra-functional modified vinylbenzyl PPE | Compound A | 100 | 100 | | 100 | 100 | | | |
| | methacrylate-terminated bisphenol A PPE | SA-9000 | | | | | | 100 | 100 | 100 |
| | vinylbenzyl-terminated biphenyl PPE | OPE-2st 2200 | | | 100 | | | | | |
| | bismaleimide | BMI-70 | | 30 | | | | | | 30 |
| peroxide | peroxide | 25B | 1 | 1 | 1 | 1 | 1 | 1 | 1 | 1 |
| inorganic filler | silica | SC 2050 SJ | 70 | 70 | 70 | 70 | 70 | 70 | 70 | 70 |
| solvent | toluene | | 50 | 50 | 50 | 50 | 50 | 50 | 50 | 50 |
| | butanone | | 30 | 30 | 30 | 30 | 30 | 30 | 30 | 30 |

TABLE 2

| Component | Type | Example | E3 | E4 | E5 | E6 | E7 | E8 | E9 | E10 |
|---|---|---|---|---|---|---|---|---|---|---|
| flame retardant | high melting point phosphorous flame retardant | Flame Retardant A | 25 | 35 | 35 | 35 | 40 | 25 | 35 | 35 |
| | phosphazene flame retardant | SPB-100 | | | | | | | | |
| | condensed phosphate | PX-202 | | | | | | | | |
| | hydroxyl-containing phosphorous flame retardant | XZ92741 | | | | | | | | |
| vinyl compound | tetra-functional modified vinylbenzyl PPE | Compound A | 100 | 100 | 100 | 100 | 100 | 100 | 100 | 100 |
| | EPDM rubber | trilene 67 | | 5 | 5 | 5 | 5 | | | |
| | butadine-styrene copolymer | Ricon100 | | | 30 | 30 | 50 | 20 | 15 | 15 |
| | butadine-styrene copolymer | D-1118 | | | 10 | 10 | | 5 | | |
| | bismaleimide | BMI-70 | | | | 30 | | | 50 | 15 |
| peroxide | peroxide | 25B | 1 | 1 | 1 | 1 | 1 | 1 | 1 | 1 |
| inorganic filler | silica | SC 2050 SJ | 70 | 70 | 70 | 70 | 70 | 70 | 70 | 70 |
| solvent | toluene | | 100 | 100 | 100 | 100 | 100 | 100 | 100 | 100 |
| | butanone | | 30 | 30 | 30 | 30 | 30 | 30 | 30 | 30 |

TABLE 3

| Component | Type | Example | E11 | E12 | E13 | E14 | C7 | C8 | C9 | C10 | C11 |
|---|---|---|---|---|---|---|---|---|---|---|---|
| flame retardant | high melting point phosphorous flame retardant | Flame Retardant A | 80 | 20 | 45 | 45 | 90 | 10 | | | |
| | phosphazene flame retardant | SPB-100 | | | | | | | 60 | | |
| | condensed phosphate | PX-202 | | | | | | | | 60 | |
| | hydroxyl-containing phosphorous flame retardant | XZ92741 | | | | | | | | | 60 |
| vinyl compound | tetra-functional modified vinylbenzyl PPE | Compound A | 100 | 100 | 100 | 100 | 100 | 100 | 100 | 100 | 100 |
| | EPDM rubber | trilene 67 | | | 5 | 5 | 5 | | 5 | 5 | 5 |
| | butadine-styrene copolymer | Ricon100 | | | | 20 | | | | | |
| | butadine-styrene copolymer | D-1118 | | | 5 | 5 | 7.5 | | 5 | 5 | 5 |
| | bismaleimide | BMI-70 | | | 14 | 14 | 35 | | 35 | 35 | 35 |
| peroxide | peroxide | 25B | 1 | 1 | 1 | 1 | 1 | 1 | 1 | 1 | 1 |
| inorganic filler | silica | SC 2050 SJ | 70 | 70 | 70 | 70 | 70 | 70 | 70 | 70 | 70 |
| solvent | toluene | | 100 | 100 | 100 | 100 | 100 | 100 | 100 | 100 | 100 |
| | butanone | | 30 | 30 | 30 | 30 | 30 | 30 | 30 | 30 | 30 |

TABLE 4

| Property | Test item (method) | Unit | E1 | E2 | C1 | C2 | C3 | C4 | C5 | C6 |
|---|---|---|---|---|---|---|---|---|---|---|
| Glass transition temperature | Tg (DMA) | °C. | 220 | 230 | 190 | 196 | 190 | 209 | 194 | 210 |
| Thermal expansion | Dimension change (TMA) | % | 2.02 | 1.75 | 3.04 | 3.05 | 3.22 | 2.33 | 3.03 | 2.31 |
| 288° C. thermal resistance | T288 (TMA) | minute | >70 | >70 | 55 | >70 | 10 | 63 | 60 | 68 |
| Solder-dip thermal resistance | S/D | cycle | >20 | >20 | >20 | >20 | 5 | >20 | >20 | >20 |
| Dielectric constant | Dk@10 GHz | None | 3.72 | 3.51 | 3.60 | 3.88 | 3.98 | 3.50 | 3.50 | 3.50 |
| Dielectric loss | Df@10 GHz | None | 0.0055 | 0.0058 | 0.0060 | 0.0059 | 0.0117 | 0.0066 | 0.0066 | 0.0067 |
| Flame retardancy | UL94 | None | V-0 | V-0 | V-1 | V-2 | V-1 | V-0 | V-0 | V-0 |

TABLE 5

| Property | Test item (method) | Unit | E3 | E4 | E5 | E6 | E7 | E8 | E9 | E10 |
|---|---|---|---|---|---|---|---|---|---|---|
| Glass transition temperature | Tg (DMA) | °C. | 220 | 208 | 201 | 190 | 198 | 204 | 224 | 215 |
| Thermal expansion | Dimension change (TMA) | % | 2.02 | 2.08 | 2.68 | 2.98 | 2.78 | 2.88 | 1.97 | 1.97 |
| 288° C. thermal resistance | T288 (TMA) | minute | >70 | >70 | >70 | >70 | >70 | >70 | >70 | >70 |
| Solder-dip thermal resistance | S/D | cycle | >20 | >20 | >20 | >20 | >20 | >20 | >20 | >20 |

TABLE 5-continued

| Property | Test item (method) | Unit | E3 | E4 | E5 | E6 | E7 | E8 | E9 | E10 |
|---|---|---|---|---|---|---|---|---|---|---|
| Dielectric constant | Dk@10 GHz | None | 3.72 | 3.68 | 3.58 | 3.69 | 3.69 | 3.69 | 3.72 | 3.72 |
| Dielectric loss | Df@10 GHz | None | 0.0055 | 0.0055 | 0.0052 | 0.0056 | 0.0056 | 0.0056 | 0.0058 | 0.0058 |
| Flame retardancy | UL94 | None | V-0 | V-0 | V-0 | V-0 | V-0 | V-0 | V-0 | V-0 |

TABLE 6

| Property | Test item (method) | Unit | E11 | E12 | E13 | E14 | C7 | C8 | C9 | C10 | C11 |
|---|---|---|---|---|---|---|---|---|---|---|---|
| Glass transition temperature | Tg (DMA) | °C. | 200 | 220 | 211 | 209 | 185 | 220 | 172 | 175 | 170 |
| Thermal expansion | Dimension change (TMA) | % | 2.32 | 2.12 | 2.02 | 2.13 | 2.22 | 2.19 | 3.45 | 3.35 | 3.55 |
| 288° C. thermal resistance | T288 (TMA) | minute | >70 | >70 | >70 | >70 | >70 | >70 | 60 | 60 | 5 |
| Solder-dip thermal resistance | S/D | cycle | >20 | >20 | >20 | >20 | >20 | >20 | 10 | 10 | 5 |
| Dielectric constant | Dk@10 GHz | None | 3.85 | 3.72 | 3.72 | 3.69 | 4.01 | 3.72 | 3.98 | 3.95 | 4.05 |
| Dielectric loss | Df@10 GHz | None | 0.0058 | 0.0055 | 0.0056 | 0.0056 | 0.0068 | 0.0055 | 0.0068 | 0.0065 | 0.0118 |
| Flame retardancy | UL94 | None | V-0 | V-0 | V-0 | V-0 | V-0 | V-0 | V-0 | V-0 | V-0 |

What is claimed is:

1. A modified polyphenylene ether resin, having a structure represented by formula (I):

  (I)

wherein, c is an integer from 3 to 12;

R represents a functional group having 3 to 12 phenolic hydroxyl groups;

Y is linked with R via O atom of the phenolic hydroxyl groups of the R group;

Y is selected from:

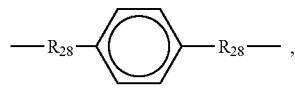

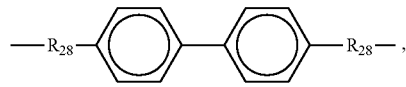

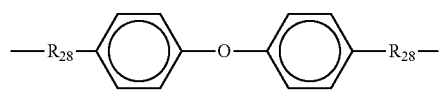

and a combination thereof;

wherein $R_{28}$ are each independently selected from C1 to C4 alkylene;

PPE has a structure represented by formula (II):

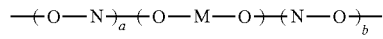  (II)

wherein M is represented by formula (III) or (IV):

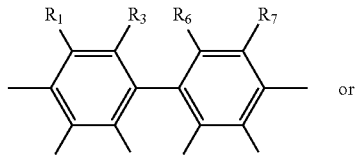  (III)

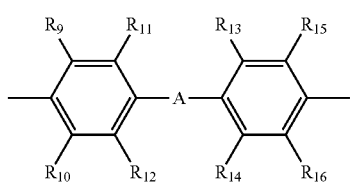  (IV)

N is represented by formula (V):

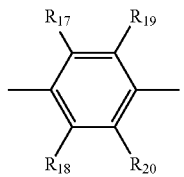  (V)

wherein $R_1$, $R_2$, $R_7$ and $R_8$ are the same or different, each independently selected from halogen, C1 to C6 alkyl and phenyl; $R_3$, $R_4$, $R_5$ and $R_6$ are the same or different, each independently selected from hydrogen, halogen, C1 to C6 alkyl and phenyl; $R_9$, $R_{10}$, $R_{11}$, $R_{12}$, $R_{13}$, $R_{14}$, $R_{15}$ and $R_{16}$ are the same or different, each independently selected from halogen, C1 to C6 alkyl, phenyl and hydrogen; A is C1 to C20 linear or branched hydrocarbyl, or is C3 to C20 cyclic hydrocarbyl; $R_{19}$ and $R_{20}$ are the same or different, each independently selected from halogen, C1 to C6 alkyl and phenyl; $R_{17}$ and $R_{18}$ are the same or different, each independently selected from hydrogen, halogen, C1 to C6 alkyl and phenyl; a and b are each independently a positive integer from 1 to 50; and Z has the following structure:

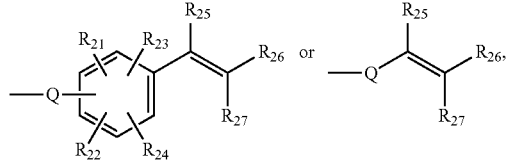

wherein $R_{26}$ and $R_{27}$ are hydrogen; $R_{21}$, $R_{22}$, $R_{23}$, $R_{24}$ and $R_{25}$ are the same or different, each independently selected from hydrogen, halogen, C1 to C6 alkyl and halogenated C1 to C6 alkyl; Q represents an organic group having at least one carbon atom, the organic group selectively comprising an oxygen atom, a nitrogen atom, a sulfur atom and/or a halogen atom.

2. The modified polyphenylene ether resin of claim 1, wherein R is a group having a structure represented by formula (A), (B) or (C):

(A)

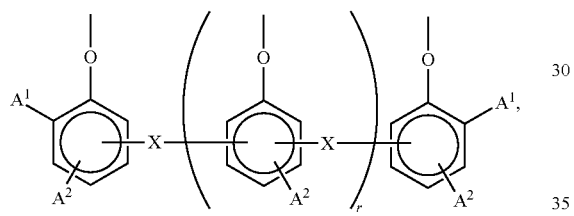

(B)

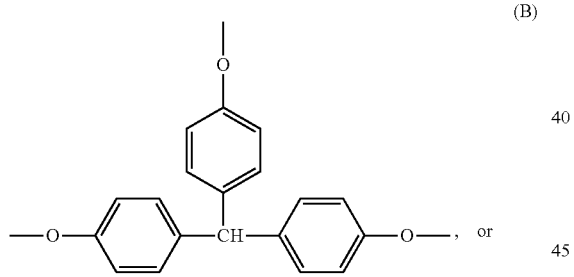

or (C)

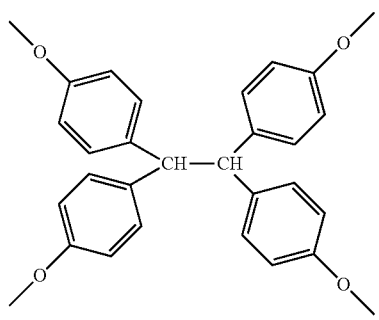

wherein $A^1$ and $A^2$ independently represent hydrogen or C1 to C4 linear alkyl; each X independently represents aliphatic hydrocarbyl, aralkyl or a substituted derivative thereof, an oxygen atom, a sulfur atom, sulfonyl or carbonyl; r is an integer from 1 to 10;

Y is selected from:

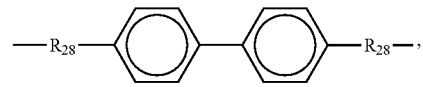

and a combination thereof;

wherein $R_{28}$ are each independently selected from C1 to C4 alkylene;

each PPE is independently selected from:

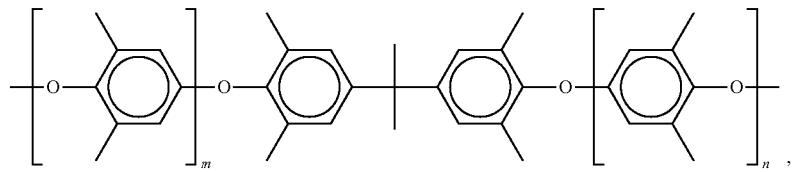

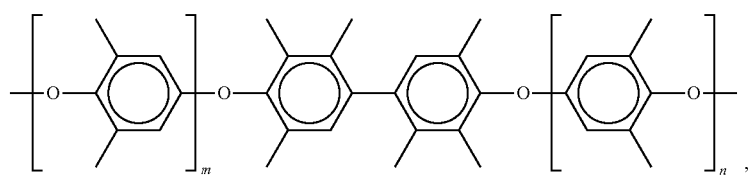

and a combination thereof,
wherein m and n are each independently a positive integer from 1 to 30;
Z has the following structure:

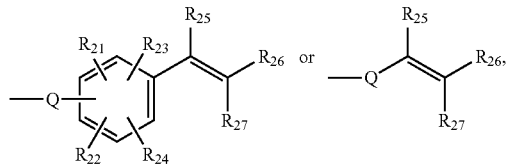

wherein $R_{26}$ and $R_{27}$ are hydrogen; $R_{21}$, $R_{22}$, $R_{23}$, $R_{24}$ and $R_{25}$ are the same or different, each independently selected from hydrogen and C1 to C4 alkyl; and Q is methylene.

3. The modified polyphenylene ether resin of claim 1, wherein,
R is selected from:

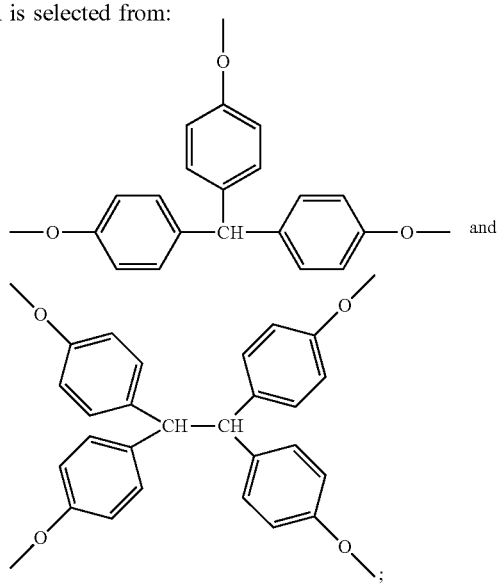

each Y independently is:

each PPE is independently selected from:

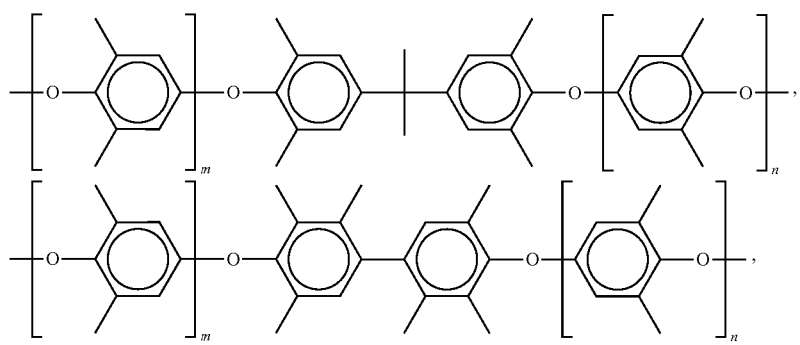

and a combination thereof,
wherein m and n are each independently a positive integer from 1 to 10; and
each Z is independently selected from —$CH_2$—CH=$CH_2$,

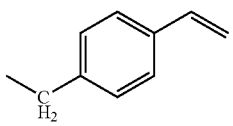

and a combination thereof.

4. The modified polyphenylene ether resin of claim 1, which is selected from

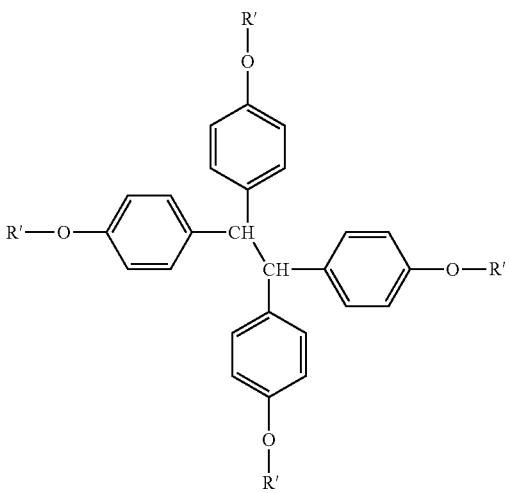

wherein each R' is the same, selected from:

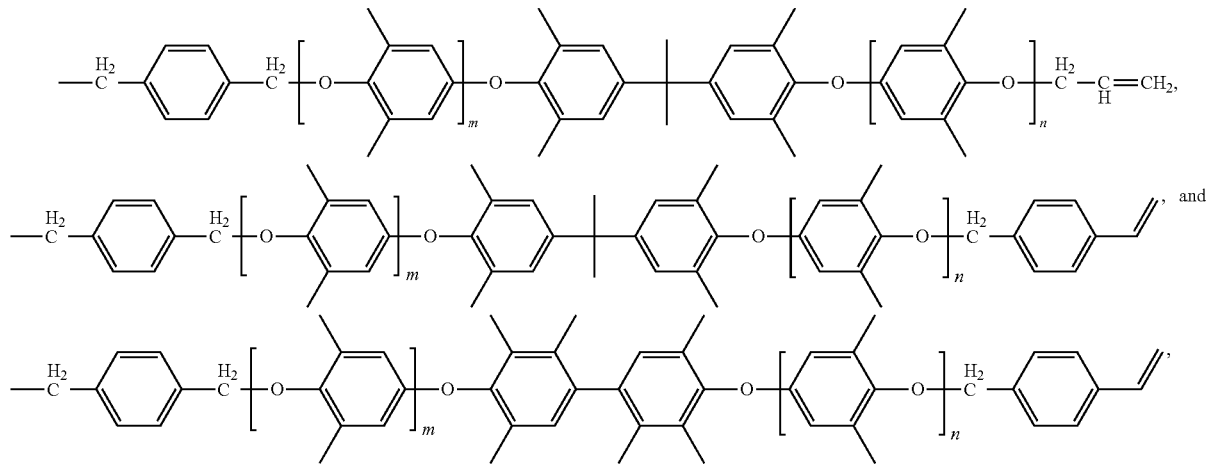

and in each formula, m and n are each independently a positive integer from 1 to 30.

5. A method of making a modified polyphenylene ether resin, comprising:
  (1) reacting a bis(haloalkyl) compound with a polyphenolic compound to obtain a first intermediate product;
  (2) reacting the first intermediate product with dihydroxyl polyphenylene ether to obtain a second intermediate product; and
  (3) reacting the second intermediate product with a vinyl compound to obtain the modified polyphenylene ether resin.

6. The method of claim 5, wherein,
the bis(haloalkyl) compound is selected from:

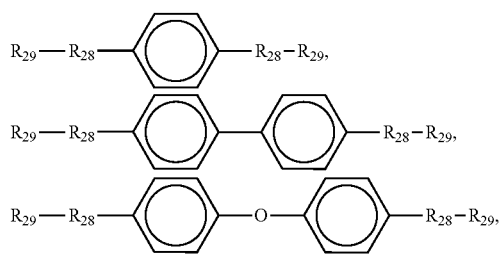

and a combination thereof;
  wherein each $R_{28}$ are independently selected from C1 to C4 alkylene; each $R_{29}$ are independently halogen;
  the polyphenolic compound has the following structure:

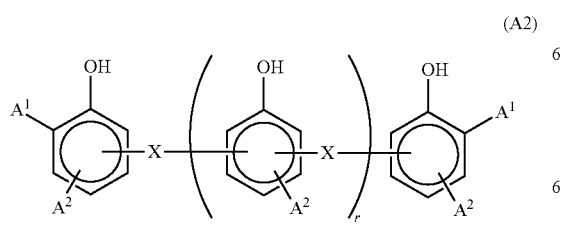

(A2)

-continued

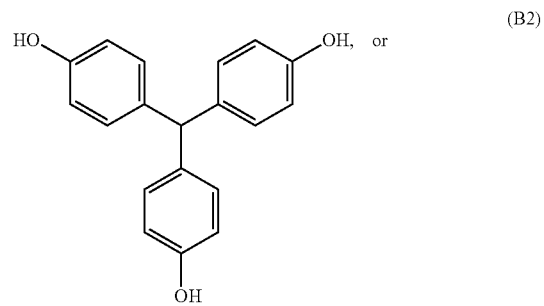

(B2)

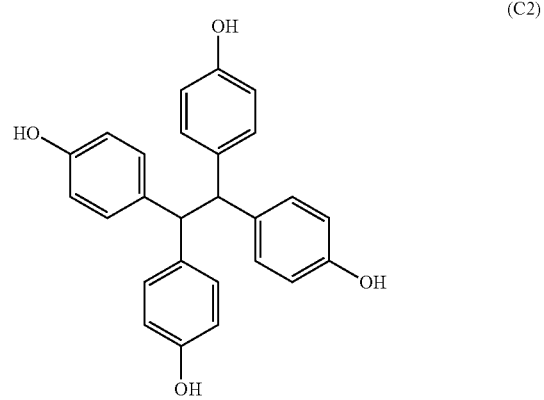

(C2)

in the formula A2, $A^1$ and $A^2$ independently represent hydrogen or C1 to C4 linear alkyl;
  each X independently represents aliphatic hydrocarbyl, aralkyl or a substituted derivative thereof, an oxygen atom, a sulfur atom, sulfonyl or carbonyl; r is an integer from 1 to 10;
  the dihydroxyl polyphenylene ether has the following structure:

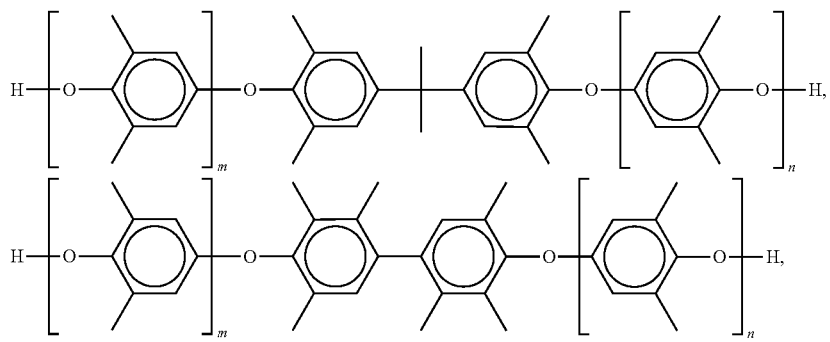

and a combination thereof,
wherein each m and n are independently a positive integer from 1 to 30;
the vinyl compound is selected from an aromatic compound comprising vinyl and halogen, an aliphatic compound comprising vinyl and halogen, and methacrylic acid.

7. A resin composition, comprising:
100 parts by weight of the modified polyphenylene ether resin of claim 1, and
20 to 80 parts by weight of a flame retardant having the following structure:

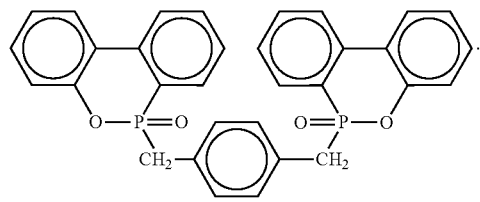

8. The resin composition of claim 7, further comprising a vinyl compound and/or a vinyl polymer.

9. The resin composition of claim 8, wherein the vinyl compound and/or the vinyl polymer is selected from an ethylene-propylene-diene monomer rubber, a butadiene-styrene copolymer, bismaleimide and a combination thereof.

10. The resin composition of claim 7, further comprising at least one of a second flame retardant, an inorganic filler, a curing accelerator, a solvent, a surfactant and a crosslinking agent.

11. An article made from the resin composition of claim 7, comprising a resin film, a prepreg, a resin coated copper, a laminate or a printed circuit board.

* * * * *